(12) United States Patent
Kaneko et al.

(10) Patent No.: US 10,199,762 B2
(45) Date of Patent: Feb. 5, 2019

(54) WATERPROOF ELECTRONIC CONTROL DEVICE

(71) Applicant: Mitsubishi Electric Corporation, Tokyo (JP)

(72) Inventors: Akira Kaneko, Tokyo (JP); Tadayuki Fujimoto, Tokyo (JP); Ryoji Saki, Tokyo (JP); Kensuke Takeuchi, Tokyo (JP)

(73) Assignee: Mitsubishi Electric Corporation, Chiyoda-ku, Tokyo (JP)

( * ) Notice: Subject to any disclaimer, the term of this patent is extended or adjusted under 35 U.S.C. 154(b) by 0 days.

(21) Appl. No.: 15/569,126

(22) PCT Filed: Jun. 18, 2015

(86) PCT No.: PCT/JP2015/067557
§ 371 (c)(1),
(2) Date: Oct. 25, 2017

(87) PCT Pub. No.: WO2016/203600
PCT Pub. Date: Dec. 22, 2016

(65) Prior Publication Data
US 2018/0109027 A1 Apr. 19, 2018

(51) Int. Cl.
*H01R 13/52* (2006.01)
*H05K 5/02* (2006.01)
(Continued)

(52) U.S. Cl.
CPC ......... *H01R 13/5202* (2013.01); *B60R 16/02* (2013.01); *B60R 16/0215* (2013.01);
(Continued)

(58) Field of Classification Search
CPC .... H01R 13/5202; H05K 5/0247; H05K 5/03; H05K 5/052; H05K 5/061; H05K 5/069
See application file for complete search history.

(56) References Cited

U.S. PATENT DOCUMENTS 7,227,757 B2 * 6/2007 Mizutani ............ H01R 13/5202
174/59
7,755,907 B2 * 7/2010 Inagaki ............... B60R 16/0239
174/50.5

(Continued)

FOREIGN PATENT DOCUMENTS

JP 2003-063325 A 3/2003

*Primary Examiner* — James Harvey
*Assistant Examiner* — Oscar Jimenez
(74) *Attorney, Agent, or Firm* — Sughrue Mion, PLLC; Richard C. Turner

(57) ABSTRACT

The invention relates to a waterproof electronic control device such that a connector unit is inserted into at least one wall face of a case, a control substrate is incorporated in a housing chamber formed of the case and connector unit, an aperture portion and an upper face of the connector unit are covered with a cover, and a waterproofing member is disposed on a contact surface of each of the case, connector unit, and cover. A structure is such that a first inclined portion is provided in a side wall of one portion of the case, a regulating wall is provided in a direction opposing an inclined face of the first inclined portion, a second inclined portion of the connector unit is provided in a position opposing the first inclined portion and comes into contact with an inner face of the regulating wall when inserted into the case, and the first inclined portion and the second inclined portion come into contact at a final insertion stage of the second inclined portion.

11 Claims, 5 Drawing Sheets

(51) Int. Cl.
  *H05K 5/06* (2006.01)
  *B60R 16/02* (2006.01)
  *H05K 5/03* (2006.01)

(52) U.S. Cl.
  CPC ........... *H01R 13/52* (2013.01); *H05K 5/0247* (2013.01); *H05K 5/06* (2013.01); *H05K 5/061* (2013.01); *H05K 5/069* (2013.01); *H05K 5/03* (2013.01)

(56) References Cited

U.S. PATENT DOCUMENTS

| | | | | |
|---|---|---|---|---|
| 8,727,794 B2* | 5/2014 | Tanaka | ................... | H05K 5/064 361/752 |
| 8,942,001 B2* | 1/2015 | Kawai | ................. | H05K 5/0052 174/50.5 |
| 9,688,228 B2* | 6/2017 | Azuma | ................... | B60R 21/01 |
| 9,730,349 B2* | 8/2017 | Nuriya | .................... | H05K 5/03 |
| 2002/0112870 A1* | 8/2002 | Kobayashi | ........... | H05K 5/0052 174/50 |
| 2007/0109730 A1* | 5/2007 | Shigyo | ................. | H05K 5/0052 361/600 |
| 2007/0215614 A1* | 9/2007 | Matsui | ................... | H02G 3/088 220/3.2 |
| 2009/0237896 A1* | 9/2009 | Yamauchi | ............ | H05K 5/0069 361/752 |
| 2011/0292624 A1* | 12/2011 | Tanaka | ................... | H05K 5/006 361/752 |
| 2013/0120943 A1* | 5/2013 | Tamura | ................ | H05K 5/0052 361/752 |
| 2013/0271933 A1* | 10/2013 | Tanaka | ................ | H05K 5/0052 361/752 |
| 2014/0080329 A1* | 3/2014 | Yamanaka | ........... | H05K 5/0069 439/76.1 |
| 2014/0085839 A1* | 3/2014 | Nakano | ................ | H05K 5/0052 361/752 |
| 2014/0144666 A1* | 5/2014 | Lisitschew | ........... | H05K 5/0004 174/50 |
| 2014/0307399 A1* | 10/2014 | Tamura | ................ | H05K 5/0052 361/752 |
| 2014/0334116 A1* | 11/2014 | Lee | ...................... | H05K 5/0052 361/752 |
| 2017/0112004 A1* | 4/2017 | Takamatsu | ........... | H05K 5/0052 |
| 2017/0291561 A1* | 10/2017 | Saki | ................... | B60R 16/0239 |

* cited by examiner

US 10,199,762 B2

WATERPROOF ELECTRONIC CONTROL DEVICE

CROSS REFERENCE TO RELATED APPLICATIONS

This application is a National Stage of International Application No. PCT/JP2015/067557 filed Jun. 18, 2015, the contents of all of which are incorporated herein by reference in their entirety.

TECHNICAL FIELD

The present invention relates to technology that improves waterproofing between, in particular, a case and cover and a connector periphery in a vehicle-use electronic control device, such as an electric power steering device, for which waterproofing is required.

BACKGROUND ART

In an existing waterproof electronic control device, a waterproofing structure of, in particular, a connector periphery is such that a groove or depressed portion is provided in a case that comes into contact with an outer periphery of the connector, an O-ring, which is a waterproofing member, is fitted in the groove or depressed portion, and a sealing agent is applied, whereby airtightness is secured by the connector outer periphery and a case being caused to adhere closely across the waterproofing member (refer to Patent Document 1).

CITATION LIST

Patent Literature

SUMMARY OF INVENTION

Technical Problem

The airtight structure of the connector periphery disclosed in Patent Document 1 is a structure such that waterproofing can be secured by interposing a waterproofing member, but when a waterproofing member, in particular a sealing material with little fluidity, is used when assembling, an edge portion on the outer periphery of the connector pushes out the sealing agent, when the connector is inserted into the case, and there is insufficient sealing agent in a place from which the sealing agent has been pushed out. Meanwhile, the pushed out sealing agent may accumulate in a place in which the sealing agent is unnecessary, forming an obstacle when the case and connector are covered with the cover (lid). Consequently, in this kind of case, the waterproofing member cannot be disposed in accordance with the design thereof, and by extension, the required waterproofing cannot be secured, because of which work such as a further application is needed.

The invention, having been contrived in order to resolve the heretofore described kind of problem with the existing device, provides a waterproof electronic control device such that waterproofing between, in particular, connector periphery and a case and cover can be secured easily and reliably.

Solution to Problem

A waterproof electronic control device according to the invention is a waterproof electronic control device formed of a bottomed case enclosed by at least one first side wall and a second side wall higher than the first side wall and having an aperture portion in an upper portion, a connector unit attached to the first side wall side of the case and carrying out an electrical connection with an interior of the case, and a cover that covers the aperture portion of the case and an upper portion of the connector unit, wherein a waterproofing member is disposed on a contact face of each of the case, connector unit, and cover, and is characterized in that a first inclined portion that inclines continuously from the second side wall to the first side wall, and a first joint portion having a regulating wall disposed in a direction opposing the first inclined portion, are formed on the side of the case to which the connector unit is attached, and a second inclined portion that opposes the first inclined portion when inserted into the case, and a second joint portion that comes into contact with an inner face of the regulating wall when inserted into the case and brings the first inclined portion and second inclined portion into contact at a final insertion stage thereof, are formed in the connector unit.

Advantageous Effects of Invention

According to the invention, at a final stage of an operation of inserting a connector unit into a case, a first inclined portion provided in the case and a second inclined portion provided in the connector unit are brought into contact, whereby a desired waterproofing can be secured without wasting an applied sealing agent.

DESCRIPTION OF EMBODIMENTS

First Embodiment

Figure 1:
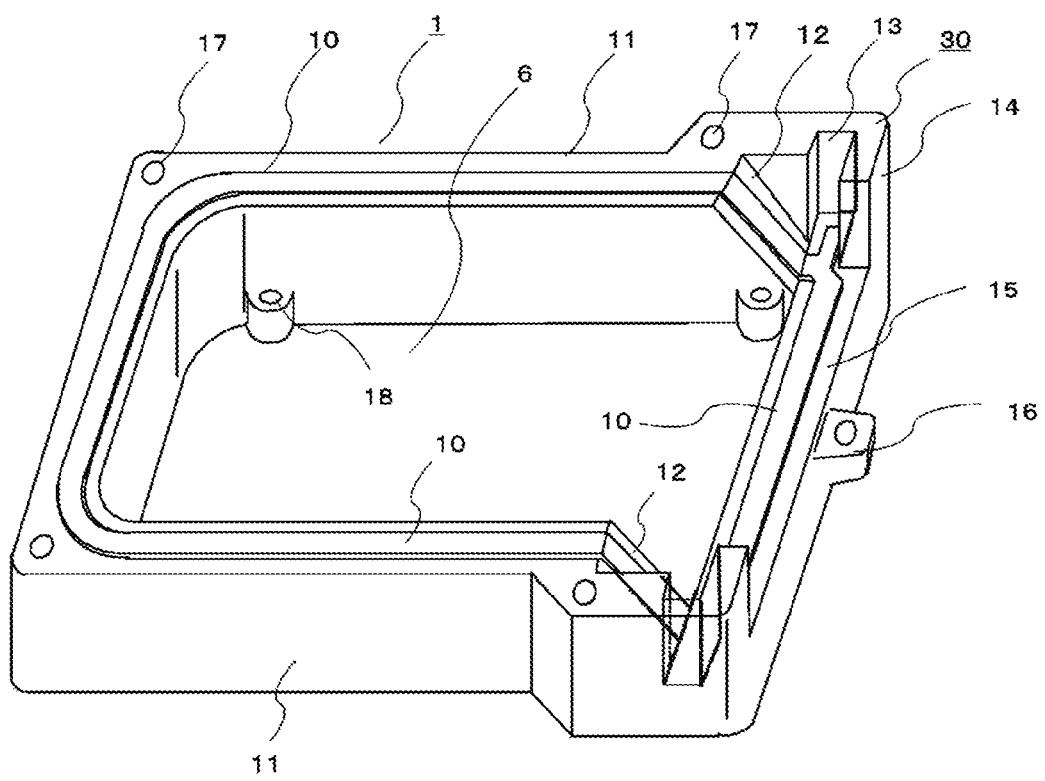
FIG. 1 is a perspective view of a case in a first embodiment.
Figure 2:
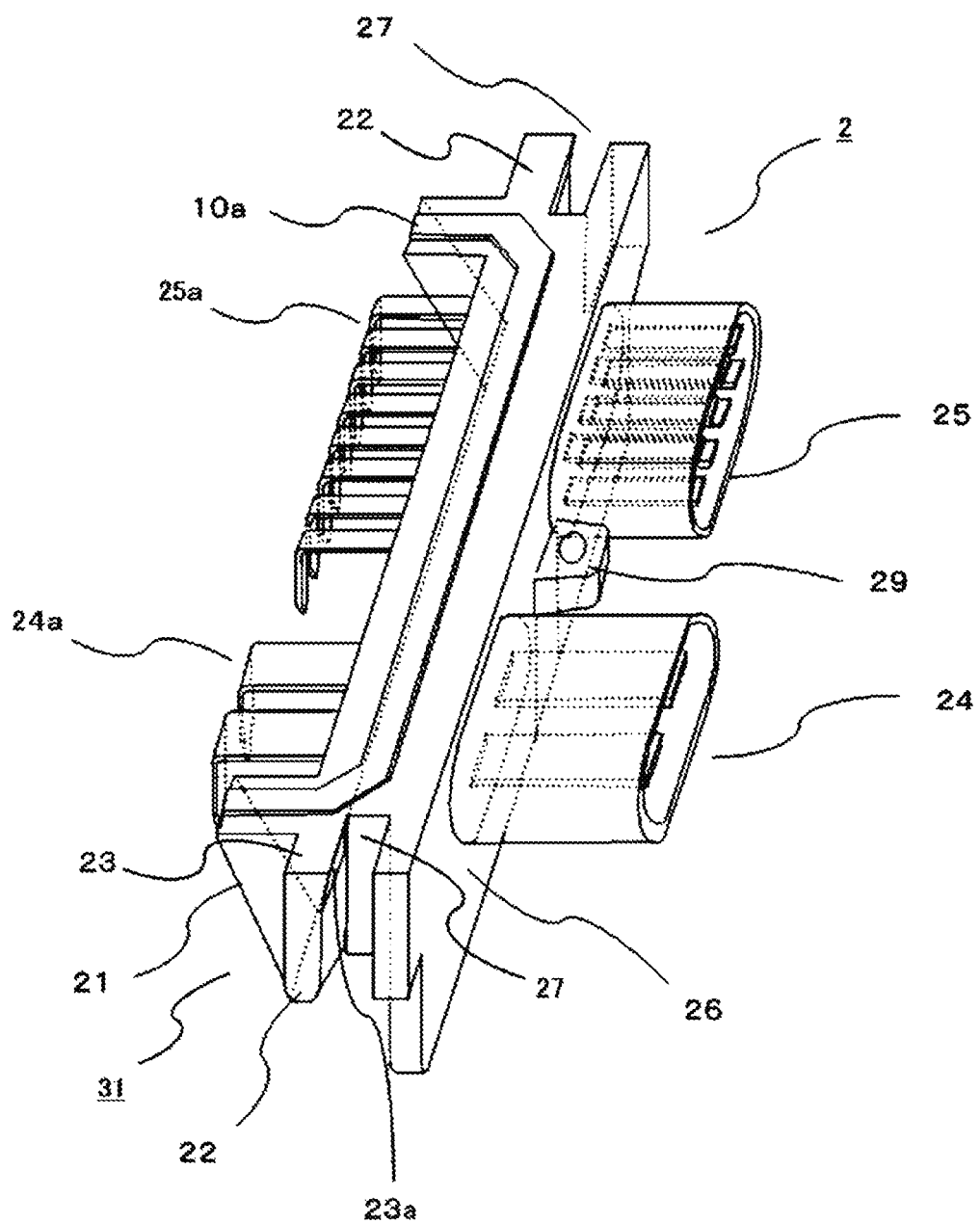
FIG. 2 is a perspective view of a connector unit in the first embodiment.
Figure 3A:
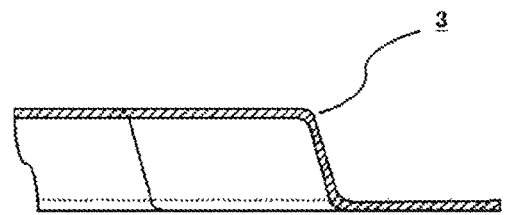
FIGS. 3A through 3C are main portion sectional views of various parts in the first embodiment.
Figure 3B:
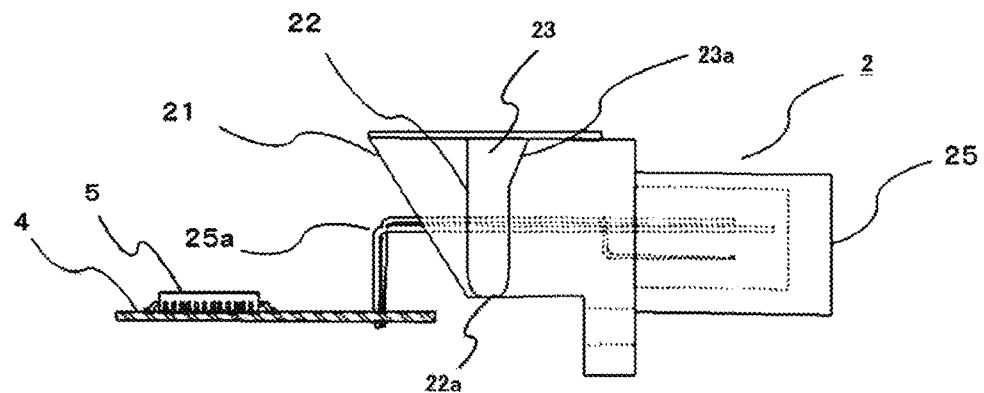
Figure 3C:
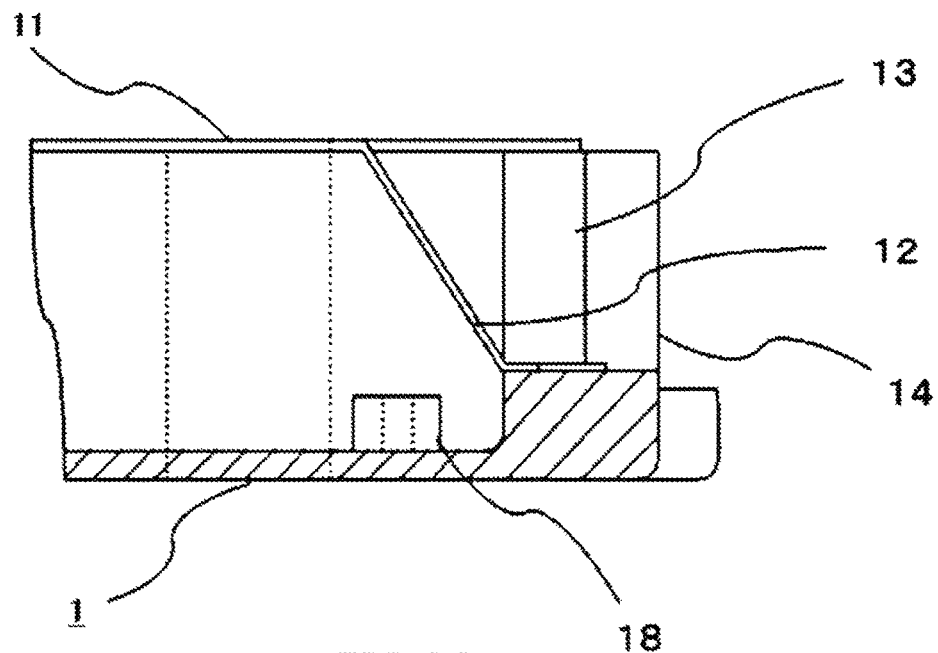

Hereafter, based on the drawings, a first embodiment of the invention will be described. FIG. 1 is a perspective view of a case 1 of an electronic control device, and FIG. 2 shows a perspective view of a connector unit 2 wherein two connector main bodies 24 and 25 are integrated by a coupling plate 26. FIGS. 3A through 3C are sectional views showing a disposition configuration immediately before assembly of a cover 3, the connector unit 2, and the case 1 respectively. The case 1 of FIG. 1 is configured, enclosing a periphery, of a bottomed, comparatively high side wall 11 that forms three faces, and a side wall 15 lower than the side wall 11, and is opened in an upward direction. The connector unit 2 shown in FIG. 2 is attached to the low side wall 15. A bearing surface 16 for fixing the connector unit 2 and case 1 is provided on an outer side of the side wall 15. A control substrate 4, electronic part 5, and the like (FIG. 3B), are disposed in a housing chamber 6 enclosed by the side walls. Also, a multiple of seats 18 for attaching the control substrate 4 are disposed in a vicinity of a bottomed portion of the side walls 11 and 15 inside the housing chamber 6.

A rail-form projection 10 is disposed continuously on upper faces of the side walls 11 and 15, and a screw hole 17 for coupling with the cover 3 is provided in four places. The case 1 is formed of an insulating resin or aluminum, and prevents water ingress. A first inclined portion 12 inclining continuously from the second side wall 11 to the first side wall 15 in two places, and a joint portion 30 for inserting the connector unit 2, are formed on the side of the case 1 to which the connector unit is attached. The joint portion 30 protrudes on an outer side of the first inclined portion 12, a groove 13 in which is inserted a second screen portion 22 of the connector unit 2, to be described hereafter, is formed on an inner side of the joint portion 30, and a regulating wall 14 that forms one portion of an inner wall of the groove 13 and extends in a direction opposing the first inclined portion 12, that is, an extending direction of the side wall 15, is provided.

Meanwhile, the connector unit 2 of FIG. 2 forms a connector assembly wherein the two kinds of connector main body 24 and 25 are integrated, but there may equally well be one kind of connector main body, or an assembly of three or more connector main bodies. The coupling plate 26 is provided on a periphery of the connector main bodies 24 and 25 in order to couple the connector main bodies 24 and 25. Terminals 24a and 25a, which are connector pins, are extended in a direction of an interior of the case 1, penetrating the coupling plate 26.

A joint portion 31 formed of a second inclined portion 21 that opposes the first inclined portion 12 when inserted into the case 1, the screen portion 22 that is inserted into the groove 13 of the case 1, and a groove 27 formed together with the screen portion 22 on a side opposite to that of the second inclined face 21, is provided in either end portion of the coupling plate 26. Also, a protruding portion 29 is provided in a central portion of the connector unit 2, the bearing surface 16 of FIG. 1 opposes the protruding portion 29, and the connector unit 2 is fixed to the case 1 after insertion with a screw or the like. Also, a projection 10a is disposed in the same way as the projection 10 of the case 1 on an upper face of the connector unit 2, and is positioned in the same horizontal plane as the projection 10 on the high side wall 11 of the case 1, whereby sealing with the cover 3 is effectively implemented.

Assembly of the case 1 with the connector unit 2 and cover 3 will be described using FIG. 3A, FIG. 3B, and FIG. 3C, which are sectional views of the cover 3, connector unit 2, and case 1 respectively, showing only a periphery of the connector unit 2. Firstly, the control substrate 4 on which the electronic part 5 and the like are mounted, and the terminals 24a and 25a of the connector unit 2, are integrated by connecting. Subsequently, the inclined portion 21 and screen portion 22 of the connector unit 2 are inserted from above so as to dovetail with the inclined portion 12 and groove 13 of the case 1, and the control substrate 4 is fixed to the seat 18. Subsequently, fixing is carried out by the protruding portion 29 of the connector unit 2 and the bearing surface 16 of the case 1 being fastened by screwing, and the side wall 11 of the case and the upper face of the connector unit 2 being covered with the cover 3. The assembly is completed in the heretofore described process order.

In a case of a non-waterproof structure, assembly is completed by the heretofore described regions being assembled as above, but in order to secure waterproofing, a waterproofing process has to be carried out between the regions. For example, when using a method whereby a sealing agent is applied, a waterproof structure is formed by the connector unit 2 being fitted after the sealing agent is applied to the side walls 11 and 15 and inclined portion 12 of the case 1. Waterproofing between an upper portion of the high side wall 11 of the case and the cover 3 is such that of the sealing agent applied to the upper face of the side wall 11, the sealing agent on the projecting portion 10 is pushed out by the cover 3 being brought into contact and accumulates on both side faces, and waterproofing between the cover 3 and the upper face of the side wall 11 is secured by the sealing agent on both sides of the projecting portion 10.

However, a case in which the desired waterproofing cannot be secured even by the heretofore described assembly process is occasionally seen. In the case of a structure with large areas, and such that the whole areas are joined at once, as with the upper face of the side wall 11 and the cover 3, there is no movement of the sealing agent other than that envisaged, because of which waterproofing can be secured. Depending on a fitting structure, however, movement of the sealing agent may occur. That is, when two regions are fitted, the sealing agent is pushed out and a lack of sealing agent occurs in one portion, in addition to which a large amount of the sealing agent that has been pushed out is built up and an accumulated portion exists, because of which the fitting positions of the two regions deviate, and a need to wipe off excess sealing agent arises. Furthermore, when leaving a large gap between the two regions, a certain amount of sealing agent movement can be accommodated in order to apply a large amount of sealing agent, but leaving a large gap in this way not only means that a large amount of sealing agent has to be applied, but there is also a case in which it is difficult to obtain the desired waterproofing even when a large amount of sealing agent is applied. This is because waterproofing can best be secured by applying an amount appropriate to the sealing agent used.

Because of this, the inclined portion 12 of the case 1 and the inclined portion 21 of the connector unit 2 are such that a space needs to be maintained between the two when the two regions are fitted, and pushing out of the sealing agent can be prevented by the two regions being disposed in predetermined positions, and the two inclined portions being brought into contact lastly. Because of this, a width and height of the regulating wall 14 are specified so that the screen portion 22 of the connector unit 2 can be inserted with play in the groove 13 of the case. Also, a width of a leading end 22a of the screen portion 22 is small in order that the leading end 22a is inserted easily. Even when the screen portion 22 is inserted in a position halfway into the groove 13, there is a space between the two inclined portions 12 and 21, because of which there is no concern that the applied sealing agent will be pushed out.

When the screen portion 22 is completely inserted into the groove 13 in this state, it is expected that the two inclined portions 12 and 21 come into contact, but as the heretofore described screen portion 22 and groove 13 are loosely fitted, the two inclined portions 12 and 21 cannot come into secure contact unless a large amount of sealing agent is applied. In this embodiment, a projecting portion 23 having an inclined portion 23a is provided on an upper portion of the screen portion 22 (refer to FIG. 3B). When the screen portion 22 is inserted into the groove 13 of the case 1, the projecting portion 23 comes into contact with an inner face of the regulating wall 14 next to the groove 13, and in a position in which the screen portion 22 is completely inserted into the groove 13, one side of the connector unit 2, that is, the connector pin 24a and 25a side, moves so as to rise slightly owing to the projecting portion 23, and the two inclined portions 12 and 21 come into contact at a final insertion stage owing to a dimensional relationship between the projecting portion 23 and the groove 13 and regulating wall 14.

As heretofore described, not only is the contact area of the two regions increased owing to the inclined portions 12 and 21, but also the two inclined portions 12 and 21 first come into contact at the final insertion stage owing to the dimensional relationship between the projecting portion 23 provided on the screen portion 22 and the groove 13 and regulating wall 14, because of which the sealing agent applied can be utilized effectively, and the desired waterproofing can be secured.

A gap between the screen portion 22 and groove 13 other than in the periphery of the projecting portion 23 is set to be greater than in other places. Although this gap can also be filled by applying a sealing agent, there is little need to consider the amount of sealing applied in this position. A reason for this is that waterproofing of the connector unit 2 and case 1 is secured by the projection 10 to the inner side of the screen portion 22 and groove 13.

Also, in the final insertion position, the connector unit 2 is disposed oriented slightly upward of the horizontal owing to the projecting portion 23. Because of this, taking an angle of the upward orientation into consideration, horizontality can be maintained by the connector main bodies 24 and 25 and the terminals 24a and 25a being formed bent slightly downward.

Second Embodiment

Figure 4:
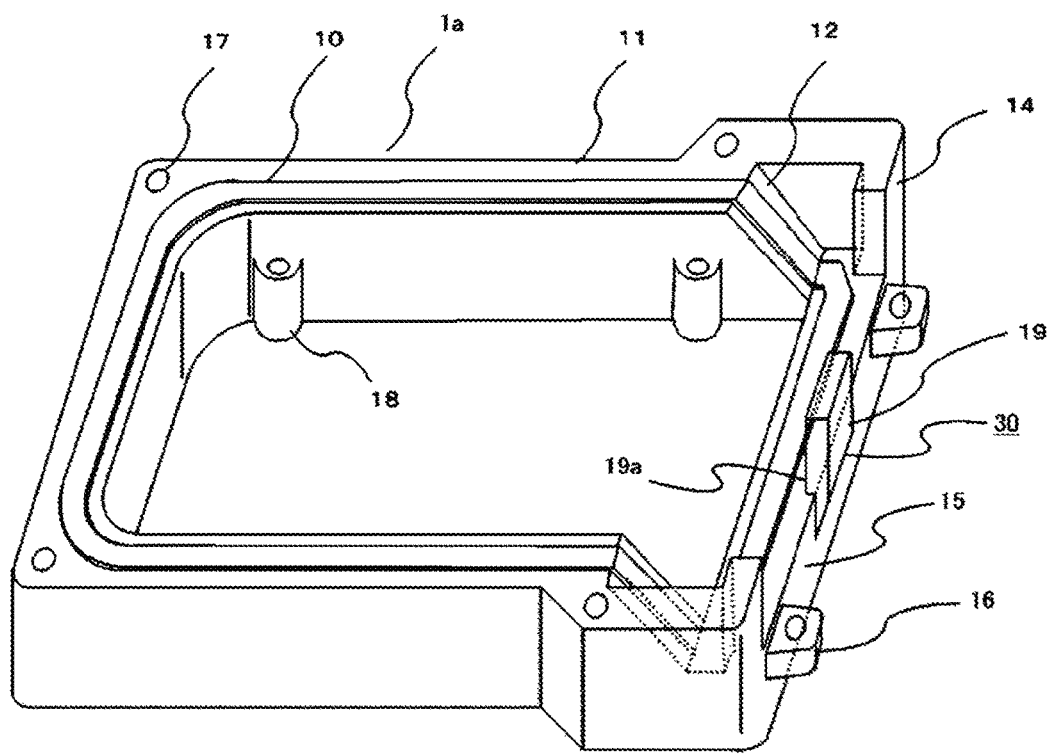
FIG. 4 is a perspective view of a case in a second embodiment.
Figure 5:
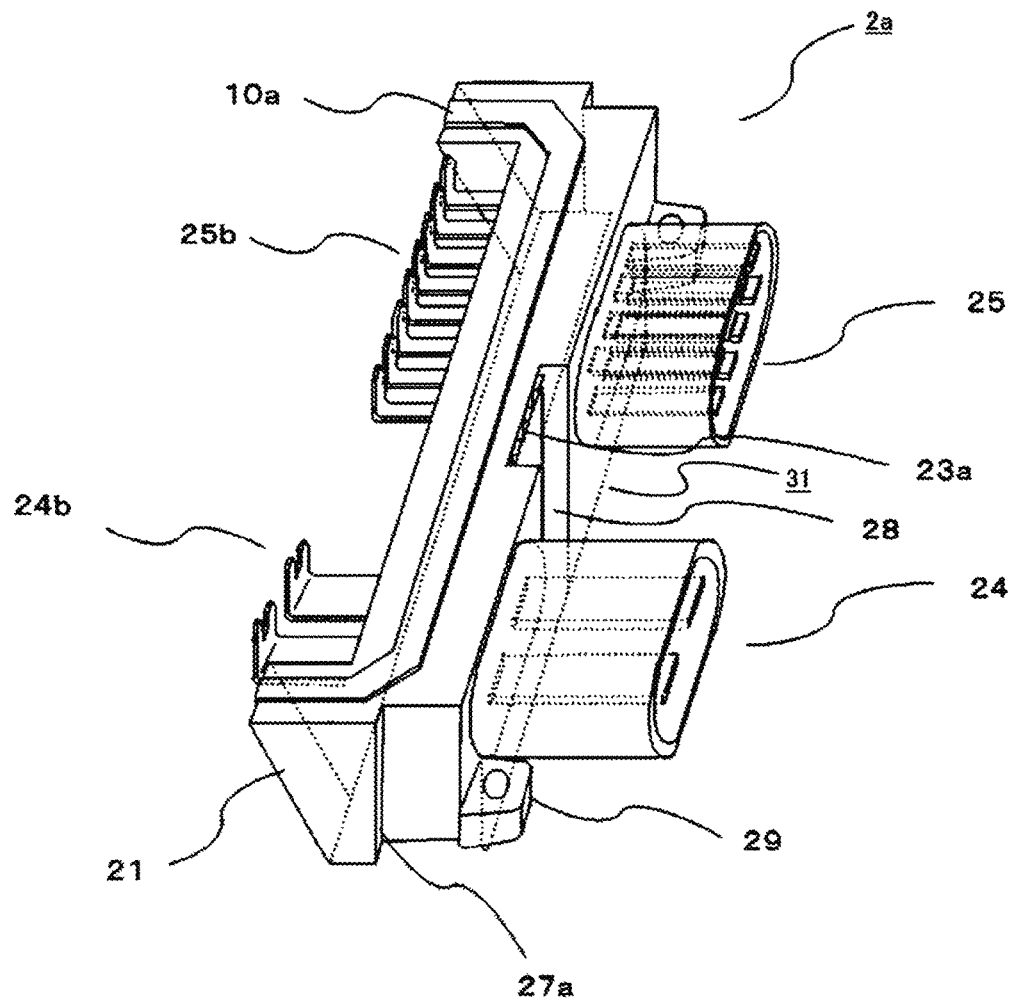
FIG. 5 is a perspective view of a connector unit in the second embodiment.

Next, based on FIGS. 4 and 5, a second embodiment of the invention will be described. The same reference signs are allotted to regions equivalent to those in the first embodiment. A portion differing from the first embodiment is mainly a configuration of the joint portions 30 and 31. In the first embodiment, the joint portions 30 and 31 are provided in either end portion of the coupling plate 26, that is, in two neighboring corners of the case 1, and the inclined portion 21, screen portion 22, and groove 27 are provided in the joint portion 31, but in this embodiment, a connector-use regulating guide 19 is disposed protruding in a place in a case 1a in which a connector unit 2a is inserted, that is, in an approximately central portion of the side wall 15, and the screen portion 22 and groove 27 previously installed in the periphery of the inclined portion 12 are omitted. Also, the disposition of the bearing surface 16 is changed from one in a central portion to one in either side portion. Furthermore, a height of the attachment seat 18 of the control substrate 4 (FIG. 3C) is greater than in the first embodiment.

Meanwhile, the connector unit 2a is such that a depressed portion 28 is provided in a portion between the connector main bodies 24 and 25, and furthermore, a multiple of projecting portions 23a are disposed in an upper portion of the depressed portion 28. Although the depressed portion 28 meshes with the connector-use regulating guide 19, the regulating guide 19 is such that one portion in a height direction thereof protrudes above an upper surface of the first side wall 15, and one portion of an inner face 19a of the regulating guide 19 is in contact with the projecting portion 23a of the connector unit 2a, to be described hereafter. Also, a groove 27a is formed on a side opposite to that of the second inclined face 21. The inclined portion 12 of the case 1a and the inclined portion 21 of the connector unit 2a are such that a space needs to be maintained between the two when the two regions are fitted, and consideration is given to the two regions being disposed in predetermined positions so that the two inclined portions come into contact lastly, which is the same as in the first embodiment. Because of this, a width and height of the regulating wall 14 of the case 1a, and of the groove 27a of the connector unit 2a which is joined to the regulating wall 14, are specified. Furthermore, in addition to the connector pins 24b and 25b being bent upward, the protruding portion 29 being provided at left and right ends of the connector unit 2 differs from the first embodiment.

Joining of the case 1a and connector unit 2a formed in this way will be described. Application of a sealing agent to the projecting portion 10, and the relationship between the case inclined portion 12 and connector unit inclined portion 1, are equivalent to those in the first embodiment. The connector unit 2a is inserted so that the depressed portion 28 fits onto the regulating guide 19 of the case 1a, and while aligning the inner face of the regulating wall 14 extended in a direction opposing the case inclined portion 12 with a face of the groove 27a. The projecting portion 23a and the inner face 19a of the regulating guide 19 first come into contact in a final insertion stage, as a result of which the connector unit 2a is pressed, and the two inclined faces 12 and 21 come into contact. Because of this, as in the first embodiment, the two faces come into contact without the sealing agent applied to the inclined portion 12 being pushed out, because of which waterproofing can be secured easily and reliably. Also, the protruding portion 29 and bearing surface 16 are fixed by screwing in order to fax the connector unit 2a to the case 1a, and furthermore, for adhering of the sealing agent.

Subsequently, the control substrate 4 on which the electronic part and the like are mounted (refer to FIG. 3B) is inserted, and the connector pins 24b and 25b are inserted into holes in the control substrate 4 and, for example, soldered. The control substrate 4 is fixed utilizing the seat 18. Lastly, the sealing agent is applied to the upper face of the high side wall 11 of the case 1a and to the projecting portion 10a of the connector unit 2, and the cover 3 (refer to FIG. 3A) is positioned, and fixed by screwing. By so doing, the assembly of all regions is completed.

According to the second embodiment, as heretofore described, a structure wherein the inclined portion 12 of the case 1a and the inclined portion 21 of the connector unit 2a eventually come into contact across the sealing agent is of a configuration such that when inserting the connector unit 2a into the case 1a, the connector unit 2a is inserted so that the regulating guide 19 of the case and the depressed portion 28 of the connector unit 2a fit together in order that the connector unit 2a can be inserted with a space between the two inclined portions 12 and 21, and the connector unit 2a is pressed by the projecting portion 23a provided in the upper portion of the depressed portion 28 on the connector unit 2a side and the regulating guide inner face 19a on the case 1a side coming into contact in the final insertion stage, as a result of which the two inclined portions 12 and 21 come into contact. Because of this, there is no occurrence of a lack of sealing agent due to the sealing agent being pushed out, or of an accumulation of a large amount of sealing agent due to an unnecessary pushing out, because of which a desired waterproofing capacity can be secured. Also, by utilizing the inclined portions, a large grounding area can be secured for the two.

Although the projecting portions 10 and 10a are provided in regions in which the sealing agent is applied, these may be depressed portions rather than projections. The projecting portion or depressed portion is provided on the upper face of the case and the upper face of the connector unit, and sealing application directions are the same, whereby the application process can also be simplified. Also, the protruding portion 29 of the connector unit is provided in a periphery of the connector main body, the bearing seat 16 is disposed facing upward in the case, these are fixed by, for example, screwing, and as a direction is the same as the direction of insertion of the connector unit in the case, coupling of the two can be consolidated. Furthermore, the direction of the screw fixing and the direction of screw fixing of the cover 3 and case 1 are caused to coincide, because of which the screws can be inserted and fixed from the same direction, whereby an increase in machinability can be achieved.

The invention not being limited to the heretofore described embodiments, the embodiments can be changed, modified, or abbreviated as appropriate, without departing from the scope of the invention.

REFERENCE SIGNS LIST 1, 1a Case, 2, 2a Connector unit, 3 Cover, 4 Control substrate, 5 Electronic part, 6 Housing chamber, 10, 10a Projecting portion, 11, 15 Side wall, 12 First inclined portion, 21 Second inclined portion, 13, 27, 27a Groove, 18 Seat, 14 Bearing surface, 16 Bearing surface, 19 Regulating guide, 19a Regulating guide inner face, 22 Screen portion, 23, 23a Projecting portion, 24, 25 Connector main body, 24a, 24b, 25a, 25b Connector pin, 26 Coupling plate, 28 Depressed portion, 29 Protruding portion, 30 First joint portion, 31 Second joint portion.

The invention claimed is:

1. A waterproof electronic control device, comprising:
a bottomed case having an aperture portion in an upper portion and constituted by at least one first side wall and a second side wall higher than the first side wall, the first side wall and the second side wall being mutually orthogonal;
a connector unit attached to the first side wall side of the case and carrying out an electrical connection with an interior of the case; and
a cover that covers the aperture portion of the case and an upper portion of the connector unit, wherein
a waterproofing member is disposed on a contact face of each of the case, the connector unit, and the cover, further comprising:
a first inclined portion that inclines continuously from the second side wall to the first side wall, and a first joint portion having a regulating wall disposed in a direction opposing the first inclined portion, are formed on the side of the case to which the connector unit is attached, and
a second inclined portion that opposes the first inclined portion when inserted into the case, and a second joint portion that comes into contact with an inner face of the regulating wall when inserted into the case and brings the first inclined portion and second inclined portion into contact at a final insertion stage thereof, are formed in the connector unit.

2. The waterproof electronic control device according to claim 1, wherein:
the first joint portion is protruded to an outer side of the first inclined portion to form a groove on an inner side thereof, and to configure an inner wall of the groove by the regulating wall, the second joint portion is provided with a screen portion that comes into contact with the inner face of the regulating wall of the case when inserted into the groove, and
a projecting portion is formed in an upper portion of the screen portion and causes the first inclined portion and second inclined portion to come into contact at a final point of insertion into the case.

3. The waterproof electronic control device according to claim 1, wherein:
the first joint portion forms a regulating guide in a position distanced from the first inclined portion of the first side wall, the second joint portion forms a depressed portion into which the regulating guide is fitted in a position corresponding to the regulating guide, and
a projecting portion that causes the first inclined portion and second inclined portion to come into contact at a final stage of insertion into the case is formed in an upper portion of the depressed portion.

4. The waterproof electronic control device according to claim 1, wherein:
the connector unit inclines in the aperture portion direction owing to the second inclined portion of the connector unit coming into contact with the first inclined portion of the case.

5. The waterproof electronic control device according to claim 1, wherein:
a waterproofing sealing agent is applied to upper faces of the side walls of the case and an upper face of the connector unit.

6. The waterproof electronic control device according to claim 1, wherein:
a bearing surface is provided on an outer wall of the case, a protruding portion is provided in a position in the connector unit opposing the bearing surface, and a direction in which the protruding portion and bearing surface come into contact is the same as a direction of inserting the connector unit into the case.

7. The waterproof electronic control device according to claim 6, wherein:
the protruding portion and bearing surface are disposed in a vicinity of a center of the connector unit or a vicinity of either end of the connector unit.

8. The waterproof electronic control device according to claim 1, wherein:
one portion of the contact face of each of the case, the connector unit, and the cover on which the waterproofing member is disposed is of a projecting form or a depressed form.

9. The waterproof electronic control device according to claim 1, wherein the entire first wall is lower than the second wall and wherein the first included portion connects the first wall and the second wall.

10. The waterproof electronic control device according to claim 1, wherein the first inclined portion connects the second side wall with the first side wall in two places.

11. The waterproof electronic control device according to claim 1, wherein the inclination is in a direction along the second side wall.

* * * * *